(12) United States Patent
Banine et al.

(10) Patent No.: US 9,606,445 B2
(45) Date of Patent: Mar. 28, 2017

(54) LITHOGRAPHIC APPARATUS AND METHOD OF MANUFACTURING A DEVICE

(71) Applicant: ASML Netherlands B.V., Veldhoven (NL)

(72) Inventors: Vadim Yevgenyevich Banine, Deurne (NL); Arthur Winfried Eduardus Minnaert, Veldhoven (NL); Marcel Johannus Elisabeth Hubertus Muitjens, Nuth (NL); Andrei Mikhailovich Yakunin, Mierlo (NL); Luigi Scaccabarozzi, Valkenswaard (NL); Hans Joerg Mallmann, Zornheim (DE); Kurstat Bal, Arnhem (NL); Carlo Cornelis Maria Luijten, Duizel (NL); Han-Kwang Nienhuys, Utrecht (NL); Alexander Marinus Arnoldus Huijberts, Veghel (NL); Paulus Albertus Maria Gasseling, Steensel (NL); Pedro Julian Rizo Diago, Veldhoven (NL); Maarten Van Kampen, Eindhoven (NL); Nicolaas Aldegonda Jan Maria Van Aerle, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 116 days.

(21) Appl. No.: 14/419,425

(22) PCT Filed: Jul. 30, 2013

(86) PCT No.: PCT/EP2013/065947
§ 371 (c)(1),
(2) Date: Feb. 3, 2015

(87) PCT Pub. No.: WO2014/020003
PCT Pub. Date: Feb. 6, 2014

(65) Prior Publication Data
US 2015/0192861 A1 Jul. 9, 2015

Related U.S. Application Data

(60) Provisional application No. 61/679,559, filed on Aug. 3, 2012, provisional application No. 61/744,804, filed
(Continued)

(51) Int. Cl.
G03F 7/20 (2006.01)
G21K 1/10 (2006.01)

(52) U.S. Cl.
CPC ...... *G03F 7/70191* (2013.01); *G03F 7/70308* (2013.01); *G03F 7/70575* (2013.01); *G21K 1/10* (2013.01)

(58) Field of Classification Search
CPC .... G03F 1/64; G03F 7/70191; G03F 7/70308; G03F 7/70575; G21K 1/10
See application file for complete search history.

(56) References Cited

U.S. PATENT DOCUMENTS

2010/0195076 A1* 8/2010 Mueller .............. G03F 1/64
355/67
2013/0010275 A1 1/2013 Medvedev et al.

FOREIGN PATENT DOCUMENTS

WO WO 2011/117009 A1 9/2011
WO WO 2011/160861 A1 12/2011

OTHER PUBLICATIONS

Chkhalo, N. I., et al., "Free-standing spectral purity filters for extreme ultraviolet lithography," Journal of Micro/Nanolithography, MEMS, and MOEMS, vol. 11, No. 2, Apr.-Jun. 2012; pp. 021115-1 to 021115-7.
(Continued)

*Primary Examiner* — Michelle M Iacoletti
(74) *Attorney, Agent, or Firm* — Sterne, Kessler, Goldstein & Fox P.L.L.C.

(57) ABSTRACT

There is disclosed a lithographic apparatus provided with a spectral purity filter which may be provided in one or more of the following locations: (a) in the illumination system, (b) adjacent the patterning device, either a static location in the radiation beam or fixed for movement with the patterning device, (c) in the projection system, and (d) adjacent the substrate table. The spectral purity filter is preferably a membrane formed of polysilicon, a multilayer material, a
(Continued)

carbon nanotube material or graphene. The membrane may be provided with a protective capping layer, and/or a thin metal transparent layer.

21 Claims, 10 Drawing Sheets

Related U.S. Application Data on Oct. 4, 2012, provisional application No. 61/723,466, filed on Nov. 7, 2012, provisional application No. 61/737,216, filed on Dec. 14, 2012.

(56) References Cited

OTHER PUBLICATIONS

International Search Report directed to related International Patent Application No. PCT/EP2013/065947, mailed Dec. 12, 2013; 5 pages.
International Preliminary Report on Patentability and Written Opinion of the International Searching Authority directed to related International Patent Application No. PCT/EP2013/065947, issued Feb. 3, 2015; 9 pages.

* cited by examiner

LITHOGRAPHIC APPARATUS AND METHOD OF MANUFACTURING A DEVICE

CROSS-REFERENCE TO RELATED APPLICATIONS

This application claims the benefit of US provisional applications 61/679,559, 61/744,804, 61/723,466 and 61/737,216, which were filed respectively on Aug. 3, 2012, Oct. 4, 2012, Nov. 7, 2012 and Dec. 14, 2012 and which are incorporated herein in their entirety by reference.

FIELD

The present invention relates to a lithographic apparatus and a method, and in particular to a lithographic apparatus with a spectral purity filter.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Another known method of producing EUV radiation is known as dual laser pulsing (DLP). In the DLP method droplets are pre-heated by a Nd:YAG laser to cause the droplet (e.g., a tin droplet) to decompose into vapour and small particles that are then heated to a very high temperature by a $CO_2$ laser.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

SUMMARY

According to a first an aspect of the invention there is provided a lithographic apparatus comprising one or more of the following components: an illumination system configured to condition a radiation beam, a support structure constructed to support a patterning device, a substrate table constructed to hold a substrate, and a projection system configured to project a pattern imparted to the radiation beam by the patterning device onto a target portion of the substrate, wherein a filter for the radiation beam is provided in a location adjacent the substrate table, wherein the filter is located adjacent the substrate table the filter at least partially closes an opening in the projection system, wherein the filter has a deep ultraviolet (DUV) transmission of less than 30% and/or is an extreme ultraviolet (EUV) transmission filter with an EUV transmission of at least 80%, wherein the filter comprises a membrane formed of one of more of: a multilayer material or graphene.

In embodiments of the invention where. The opening may be an opening provided in a wall of the projection system facing the substrate table.

In embodiments of the invention the filter is movable between a first in use position in the path of the radiation beam and a second position in which the filter is not in the path of the radiation beam. The filter may be mounted in a holder. The holder may be movable between a first location wherein the filter is provided in the first in use position and a second location wherein the filter is provided in the second position. Preferably the projection system has a projection system wall, the projection system wall including the opening, and wherein the first location comprises a recessed portion of the projection system wall surrounding the opening. Preferably the holder is provided with an inner annular wall, and when the holder is in the first location the inner annular wall forms a part of the opening. The holder is preferably provided with conduits to permit a gas to be supplied to the opening. In embodiments of the invention a closure member is provided that is adapted to close the opening when the filter is removed. The closure member may include a first conduit connecting the interior and the exterior of the projection system, and a second conduit for delivering gas to the first conduit.

In embodiments of the invention the filter is arranged for reciprocal movement between a first position in which the filter is located in the path of the radiation beam, and a second position in which the filter is located remote from the radiation beam. Preferably when in the second position the filter is located within a protective housing.

In embodiments of the invention at least one conduit is provided for supplying a gas to the opening, wherein in use gas is supplied to both sides of the filter. Preferably there is a single conduit that bifurcates to form a first channel that in use supplies gas to a first surface of the filter, and a second channel that in use supplies gas to a second surface of the filter. Preferably the first and second channels are in fluid connection.

In embodiments of the invention a gas supply is provided for supplying hydrogen gas to a surface of the filter, and a heating element is provided in the gas supply adapted in use to generate hydrogen radicals that are delivered to the surface of the filter.

In embodiments of the invention a gas supply line is provided to deliver gas to a location adjacent the filter, the gas supply line being provided with a branch that delivers gas to a location remote from the filter, the gas supply line and the branch being provided with respective flow restriction elements configured such that at a low gas flow rate gas is delivered to the filter while at a high gas flow rate the majority of gas is supplied to the remote location. The restriction element provided in the branch may be a pressure relief valve that opens when the pressure at the branch exceeds a predetermined level. The restriction element provided in the branch comprises a plurality of spaced apart stacked elements.

In embodiments of the invention a mesh may be provided located between the filter and the illumination system and/or the projection system such that in the event that the filter is damaged or broken, fragments of the filter may be caught so as not to enter the illumination and/or projection system. The mesh may be a regular structure. The mesh may have an open area of approximately 98% of the area of the mesh.

In embodiments of the invention the filter may include a reinforcing grid. Preferably the reinforcing grid includes no grid lines in the scanning direction of the apparatus. The reinforcing grid may, for example, comprises a plurality of parallel grid lines or an array of polygonal elements.

The filter may further comprise a layer of a capping material. The membrane may have a thickness of from 10 nm to 100 nm.

In embodiments of the invention wherein the filter is a multilayer the filter may comprise layers of niobium, molybdenum and silicon.

In some embodiments of the invention the filter may comprise a curved membrane adapted to compensate for transmission variation.

In some embodiments of the invention the filter may comprise a membrane of varying thickness adapted to compensate for transmission variation.

According to the present invention there is also provided a lithographic apparatus including a filter formed of polysilicon material wherein the filter has an extreme ultraviolet (EUV) transmission of at least 80%, the apparatus comprising one or more of the following components: an illumination system configured to condition a radiation beam, a support structure constructed to support a patterning device, a substrate table constructed to hold a substrate, and a projection system configured to project a pattern imparted to the radiation beam by the patterning device onto a target portion of the substrate; and wherein the filter is provided in any one or more of the following locations: (a) in the illumination system, (b) adjacent the patterning device, (c) in the projection system, and (d) adjacent the substrate table.

In one example, the filter has a deep ultraviolet (DUV) transmission of less than 30%.

In one example, the filter material comprises a polysilicon membrane having a thickness of from 10 nm to 100 nm.

In embodiments of the invention the filter may include a layer of capping material.

According to the present invention there is also provided a lithographic apparatus including a projection system configured to project in use a radiation beam onto a target portion of a substrate, the apparatus comprising a filter formed of graphene wherein the filter has an extreme ultraviolet (EUV) transmission of at least 80%, and wherein the filter is located in the projection system.

In one example, the filter has a deep ultraviolet (DUV) transmission of less than 30%.

In one example, the filter comprises a graphene membrane having a thickness of from 10 nm to 100 nm.

In embodiments of the invention the filter may include a layer of capping material.

According to the present invention there is also provided a lithographic apparatus an illumination system configured to condition a radiation beam, the apparatus comprising a filter formed of a carbon nanotube material or a multilayer material wherein the filter has an extreme ultraviolet (EUV) transmission of at least 80%, and wherein the filter is located in the illumination system.

In one example, the filter has a deep ultraviolet (DUV) transmission of less than 30%.

In one example, the filter comprises a membrane having a thickness of from 10 nm to 100 nm.

In embodiments of the invention where the filter is a multilayer material the filter may comprise layers of niobium, molybdenum and silicon In embodiments of the invention the filter may include a layer of capping material.

According to the present invention there is also provided a filter for use in a lithographic apparatus wherein the filter is adapted to be provided in any of the following locations in the lithographic apparatus: (a) in an illumination system, (b) adjacent a patterning device, (c) in a projection system, and (d) adjacent a substrate table, wherein the filter has an extreme ultraviolet (EUV) transmission of at least 80%.

In one example, the filter has a deep ultraviolet (DUV) transmission of less than 30%.

In embodiments of the invention where the filter is adapted to be located adjacent the patterning device the filter may be either mounted for movement with the patterning device or may be fixed in a static location.

In embodiments of the invention where the filter is adapted to be located adjacent the substrate table, the filter may be adapted to at least partially close an opening in the projection system.

In embodiments of the invention the filter comprises a membrane formed of one or more of: polysilicon, a multilayer material, a carbon nanotube material, or graphene. When two or more of such materials are combined in a membrane, it may be advantageous to provide it in the form of a multilayer membrane. Preferably the membrane may have a thickness of from 10 nm to 100 nm.

In embodiments of the invention the filter may further comprise a layer of capping material.

In embodiments of the invention the filter is a multilayer comprising layers of niobium, molybdenum and silicon.

In embodiments of the invention the filter may comprise a curved membrane adapted to compensate for transmission variation.

In embodiments of the invention the filter may comprise a membrane of varying thickness adapted to compensate for transmission variation.

According to the invention there is also provided a method of manufacturing a device using a lithographic apparatus, comprising: generating a beam of EUV radiation, conditioning the radiation beam in an illumination system and directing the radiation beam onto a patterning device, and projecting a patterned radiation beam onto a substrate supported on a substrate table by means of a projection system wherein the method further comprises providing a filter for the radiation beam in a location adjacent the substrate table, wherein the filter at least partially closes an opening in the projections system, wherein said opening is provided in a wall of said projection system facing the substrate table, wherein the filter comprises a membrane formed of any of: a multilayer material or graphene.

In one example, the filter is an extreme ultraviolet (EUV) transmission filter with an EUV transmission of at least 80%.

In one example, the filter has a deep ultraviolet (DUV) transmission of less than 30%.

Preferably the membrane may have a thickness of from 10 nm to 100 nm.

In embodiments of the invention the filter further comprises a layer of a capping material.

In embodiments of the invention the filter is a multilayer comprising layers of niobium, molybdenum and silicon.

In embodiments of the invention wrinkles are removed from the filter by maintaining a pressure differential across the filter.

One or more aspects of the invention may, where appropriate to one skilled in the art, be combined with any one or more other aspects described herein, and/or with any one or more features described herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the invention;

Figure 6:
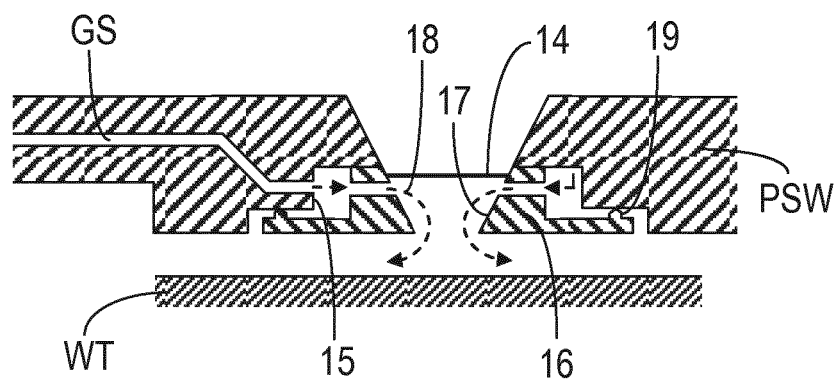
Figure 7:
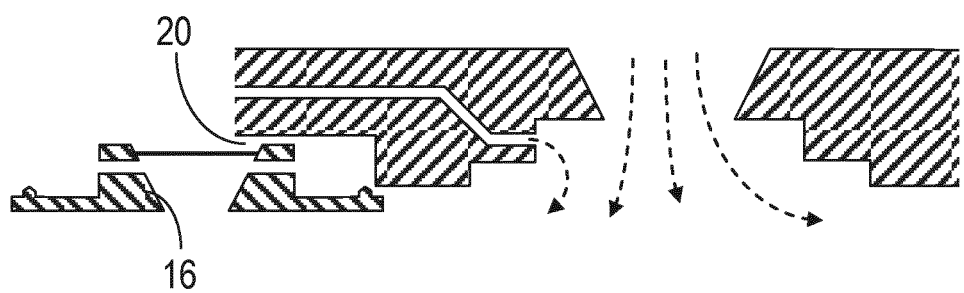
Figure 8:
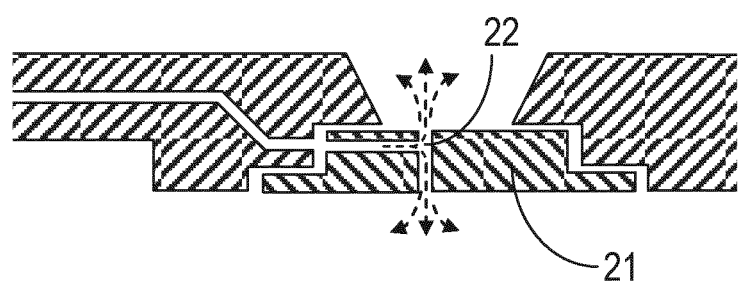
Figure 9A:
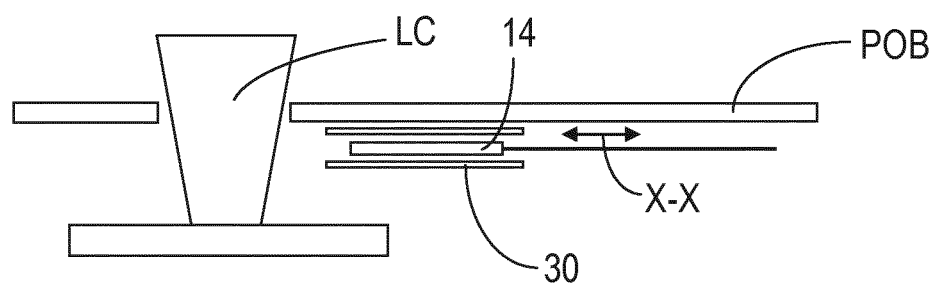
Figure 10:
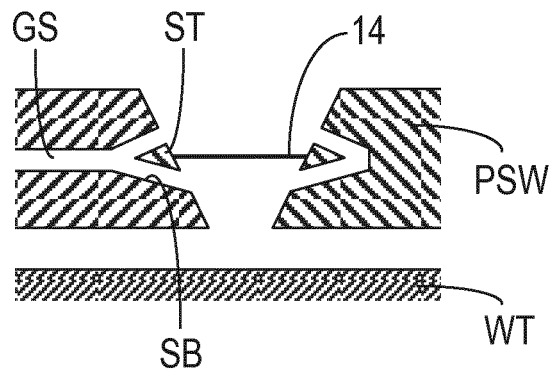
Figure 11:
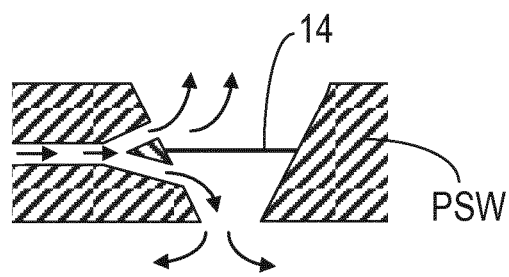
Figure 12:
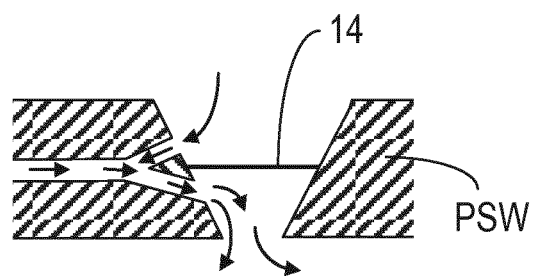
Figure 13:
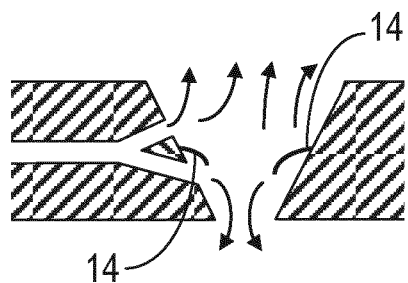
Figure 14:
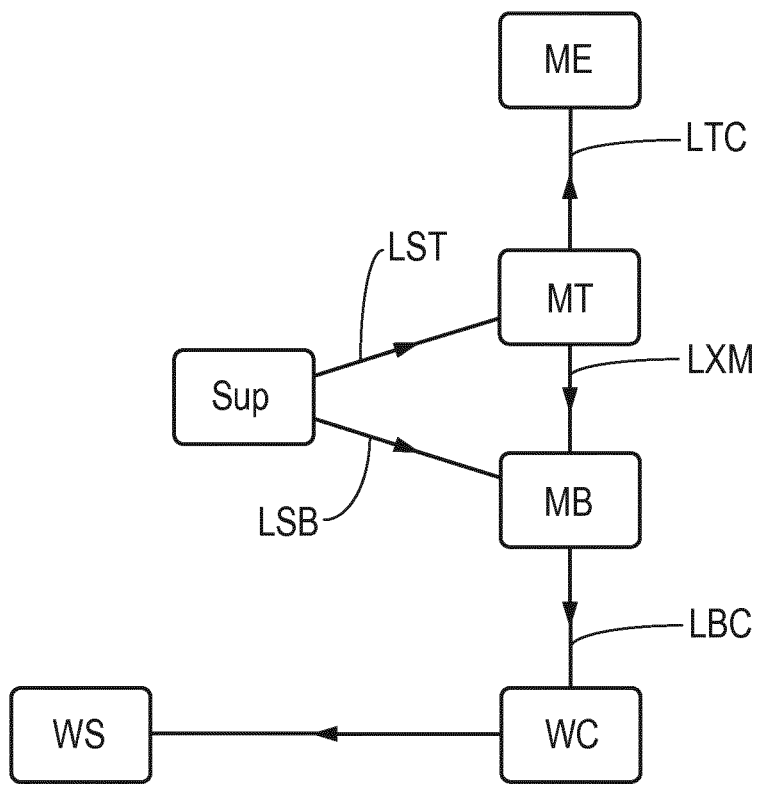
Figure 15:
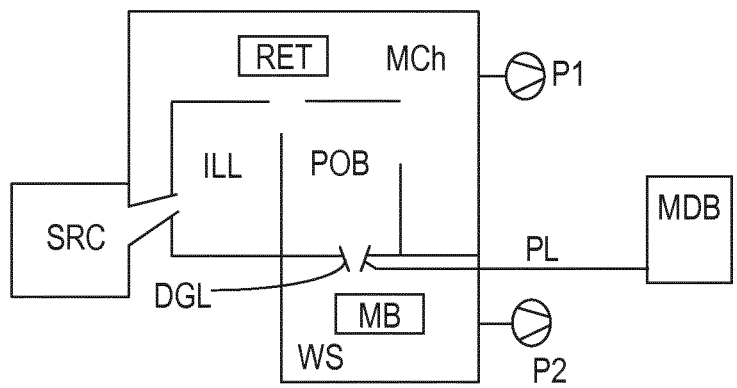
Figure 16:
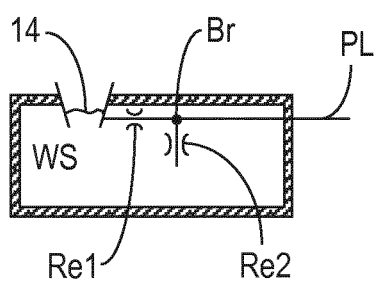
Figure 17:
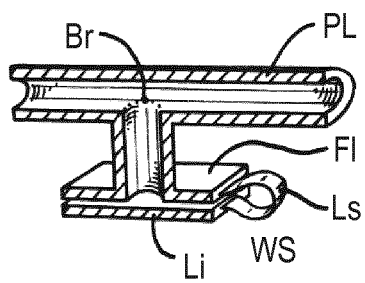
Figure 18:
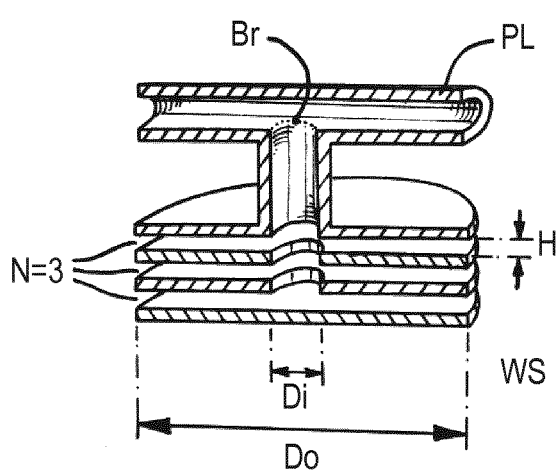
Figure 19:
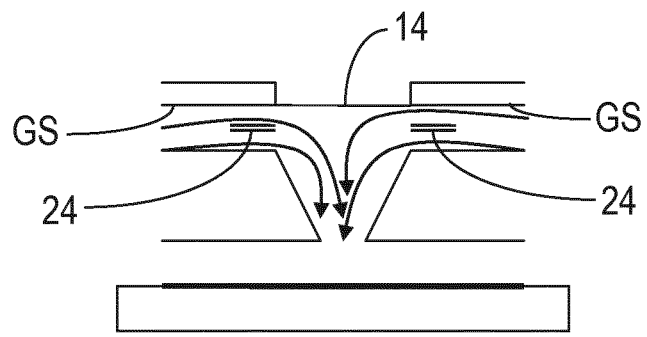
Figure 20A:
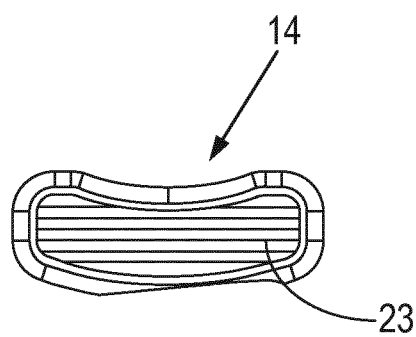
Figure 20B:
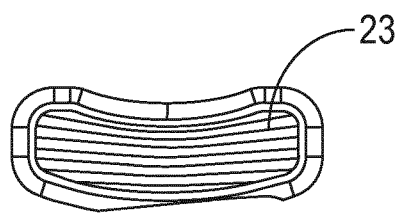
Figure 20C:
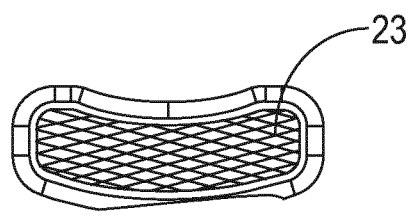
Figure 20D:
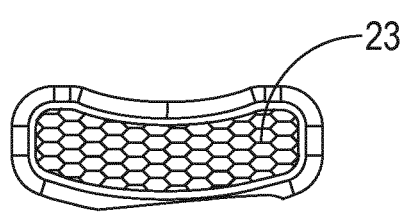
Figure 21A:
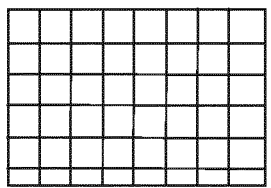
Figure 21B:
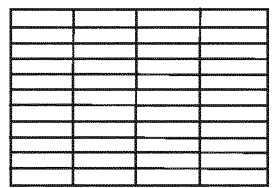
Figure 21C:
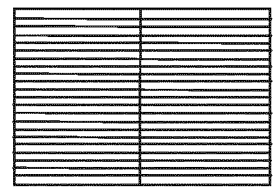

FIG. 6 shows an embodiment of a spectral purity filter formed as part of a dynamic gas lock, FIG. 7 shows the embodiment of FIG. 6 in a second position, FIG. 8 shows the embodiment of FIG. 6 replaced by a closure member, FIGS. 9(a) and (b) show an embodiment of the invention in two positions, FIG. 10 shows another embodiment of a spectral purity filter formed as part of a dynamic gas lock, FIG. 11 illustrates gas flows in the embodiment of FIG. 10, FIG. 12 illustrates gas flows in the embodiment of FIG. 10, FIG. 13 illustrates gas flows in the embodiment of FIG. 10 in the event of a break in the spectral purity filter, FIG. 14 illustrates a modelling process for modelling gas flows in the embodiment of FIG. 10, FIG. 15 shows a vacuum system architecture for a lithographic apparatus, FIG. 16 shows an embodiment of the invention in which the vacuum system architecture is modified by branching a purge line to control gas flows;

FIG. 17 shows a first example of a restriction that may be used in the embodiment of FIG. 16, FIG. 18 shows a second example of a restriction that may be used in the embodiment of FIG. 16, FIG. 19 illustrates another embodiment of the invention in which the spectral purity filter is formed as part of a dynamic gas lock, FIGS. 20(a)-(d) illustrate plan views of spectral purity filters according to embodiments of the invention, and FIGS. 21(a)-(c) show examples of a further embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
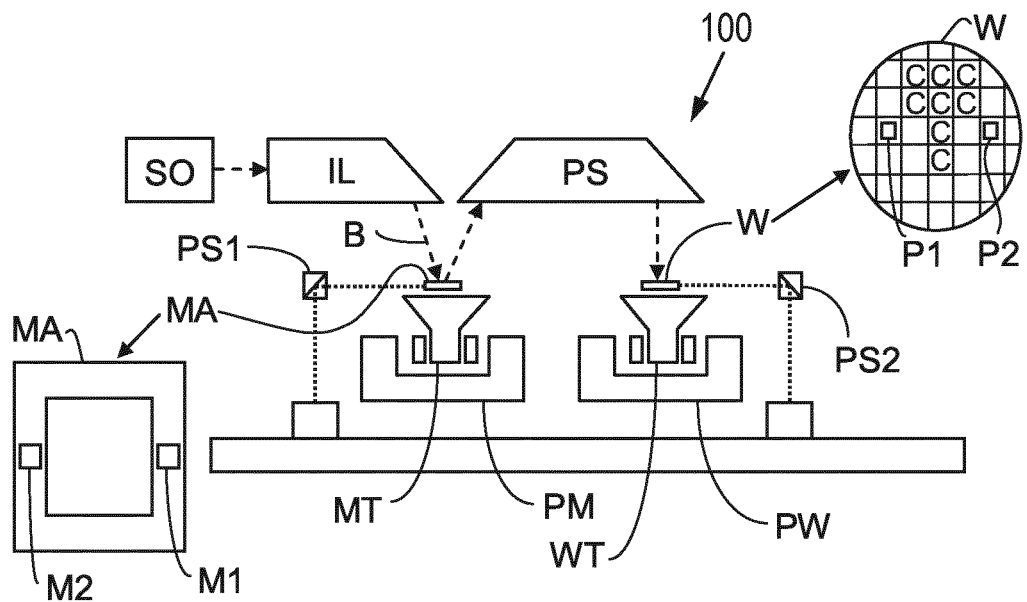

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
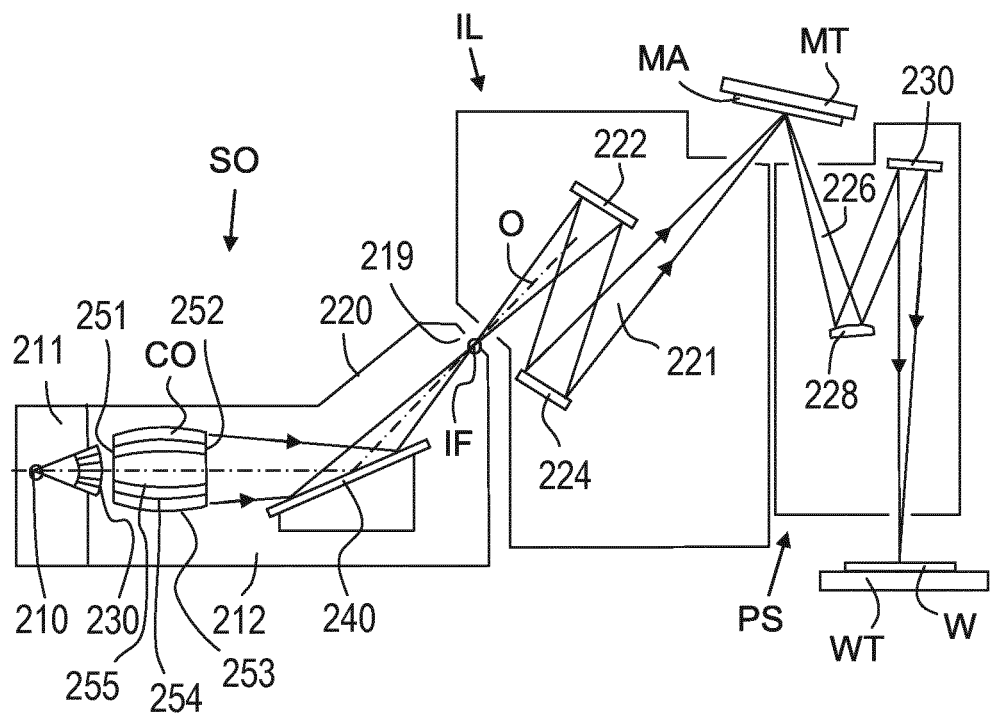
FIG. 2 is a more detailed schematic view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
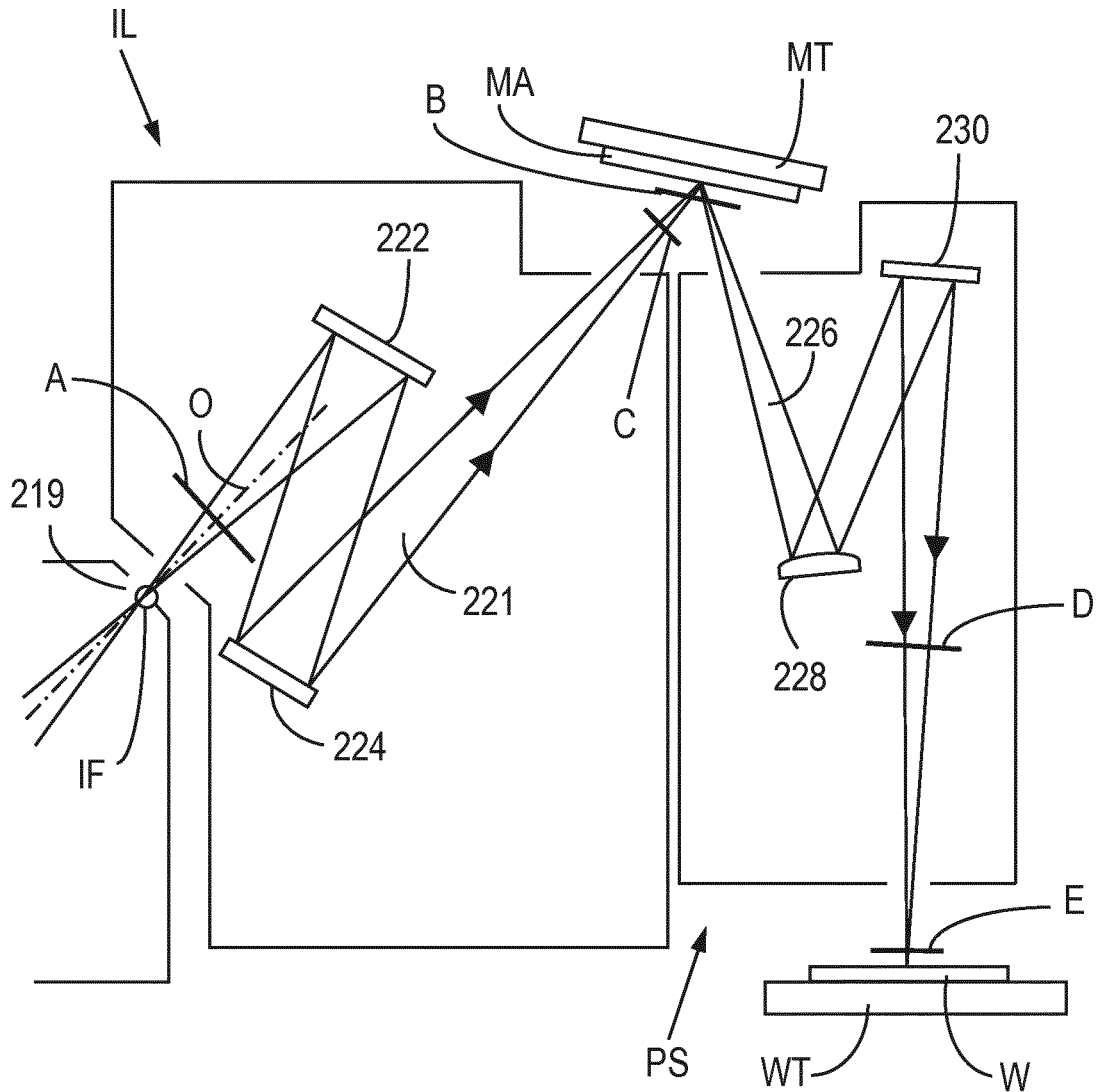
FIG. 3 is a view identical to FIG. 2 but showing schematically five possible locations A-E for the spectral purity filter.

FIG. 3 is a view similar to FIG. 2 but showing five locations marked A-E where a further spectral purity filter (SPF) may be located. Since the main part of the IR radiation is suppressed by the grating spectral filter 240 provided as part of the collector CO, the main object of this further SPF is for suppression of DUV but the further SPF may also provide additional IR suppression.

Location A is within the illumination system, for example as shown at a position within the illumination system that is after the intermediate focus 219 and before the beam reaches the first mirror 222 (however other locations within the illumination system may also be used, such as between a first and a further mirror or after the last mirror). Location B is at the reticle level close to the mask table MT. In this position the SPF may also serve as a pellicle protecting the mask from fuel droplets or other contaminants. At location B the SPF will be mounted for movement with the mask table MT. At location B the SPF is mounted substantially parallel to the mask table MT. Location C is also at the reticle level but at a further distance from the mask table MT and therefore not functioning as a pellicle. At location C the SPF is static and is not mounted for movement with the mask table MT, and is mounted in a position perpendicular to the radiation beam rather than being parallel to the mask table MT as in location B. Location D is a position within the projection system PS, for example a location between mirror 230 and an exit of the projection system. Location E is a position adjacent the wafer table, e.g., a position separating a wafer compartment from the projection system known as a dynamic gas lock. Other locations are also possible including for example within the source between the collector and the intermediate focus IF or any other suitable place in the lithographic apparatus.

The various positions A-E have different advantages and disadvantages, and the requirements of the different locations may make particular demands on the material used for the SPF. An optimum location/material combination for the SPF will have low incident power, low size and low imaging impact. Different location/material combinations will have their own strengths and weaknesses. For example, location A being shortly after the intermediate focus location has a high incident power density (e.g., 100 W/cm2 or more) and may need to be large in physical size (e.g., around 25000 mm2) because of the width of the beam at that location. The size of the SPF could be reduced if it was moved closer to the intermediate focus but then the incident power density increases. One advantage of location A, however, is that it has low imaging impact. Location B—which is at the reticle level with the SPF functioning also as a pellicle, at location B the SPF is attached to the support structure for the reticle such that it moves with the reticle. At location B there is medium incident power (e.g., 5 W/cm2) though again the SPF would need to be quite large (e.g., 14000 mm2) and the imaging impact is high. Location C is again at the reticle level but unlike location B in the case of location C the SPF is static and is placed in the radiation beam just before it reaches the reticle. Location C is medium in terms both of incident power density (e.g., 10 W/cm2) and medium size (e.g., 2000 mm2) but again has high imaging impact though depending on precise location this may be mitigated. At location D within the projection system, the SPF may have low incident power density (e.g., 1 W/cm2 or less), a size that may vary from medium to large depending on precisely where the SPF is located in the projection system, and will have low imaging impact. Finally, at location E there are the best properties in terms of incident power density (e.g., as low as 0.5 W/cm2 or less) and size (e.g., 150 mm2 or smaller), but these good properties must be offset by the fact that a SPF at location E has the greatest imaging impact of all the possible locations. The large impact on imaging at location E can be overcome if the SPF can be made to be sufficiently wrinkle-free and uniform and if this can be achieved then location E may be preferred.

There are also a number of requirements of the SPF specific to particular locations. For example, at the reticle level—locations B and C—it is advantageous that the SPF will absorb DUV while at other locations it is sufficient for DUV to be reflected. This places a particular limitation on the materials that can be used for the SPF if it is to be located at B or C.

There are various possible materials that are suitable for use as a spectral purity filter in any of these locations. Preferably however any material chosen for the SPF should have an EUV transmissivity of greater than 80% and a transmissivity of DUV of less than 30%. It is also useful if the material had a transmissivity of infra-red of less than 25% though this is less critical as IR suppression can also be achieved in the collector CO or other locations. Typically a material forming a filter may be a membrane having a thickness of between 10 nm and 100 nm. Materials meeting these requirements include a layer of polysilicon 75 nm thick, a multilayer of Nb/Mo/Si 25 nm thick, a 100 nm thick layer of carbon nanotubes, and graphene less than 20 nm thick (multiple individual layers of graphene). Any of these materials can also have the transmission of DUV and IR further reduced by adding a thin (layer thickness between 0.5 nm and 2 nm, e.g., about 1 nm) metal layer though this is at the price of a reduction in EUV transmission of about 2-3%. It may also be possible to provide the materials with a layer of a capping material which may, for example, be a material resistant to any etching or reacting agents that can harm the membrane, e.g., O and H radicals, $H_2$ and EUV. An example of such a material is $MoSi_2$. The properties of these materials may be summarised in the following table:

| | Material | Thickness | T EUV (>80% preferred) | T DUV (<30% preferred) | T IR (<25% preferred) |
|---|---|---|---|---|---|
| I | Poly-Si | 75 nm | 81% (improvable) | ~0% | 95% |
| II | ML Nb/Mo/Si (Phystex) | 25 nm | 86% | 1% | 11% (reflected) |
| III | CNT | 100 nm | 87% | 60% | 90% |
| IV | Graphene | <20 nm | 99% | 95% | |
| V | Any of above with extra thin metal layer for additional suppression | ~1 nm | Additional 2-3% absorption | Additional ~2-5x | Additional reflection of 2-10x |

Of these options the most suitable material may be considered to be the Nb/Mo/Si multilayer material II—though this should not be used in a reticle location (B or C)

owing to the reflection of IR. While there are various materials suitable for use in different locations, a particularly preferred combination may be considered to be the Nb/Mo/Si multilayer material II in position E. The polysilicon material I in location E is also a preferred option.

Other exemplary possible combinations of materials and locations include: polysilicon in any one or more of the positions; a multilayer material provided in the illumination system; graphene located in the projection system and/or adjacent the substrate table; a carbon nanotube material in the illumination system; and any of polysilicon, a multilayer material, graphene, and a carbon nanotube material, provided with a metal layer and located in any of the above identified positions.

One advantage of placing the SPF at location E—ie at the wafer stage—is that the SPF may also function to cover the opening that necessarily exists where the radiation beam exits the projection system. Care should be taken, however, to avoid any excessive pressure differential across the SPF which could cause damage and even rupture to the thin SPF membrane. One option would be for the SPF to cover most but not all of the opening from the projection system. This would have the advantage of reducing gas flow from the projection system which otherwise can have a thermal impact on the wafer. Generally, the in addition to its role as an SPF the membrane may also function as a transmission reticle, debris filter, pellicle, transmission grid or transmission filter.

FIG. 6 shows an embodiment of the invention in which an SPF membrane 14 is located as part of the dynamic gas lock (DGL). As is known the DGL is formed as an opening in the wall of the projection system (PS) facing the wafer table WT. The opening of the DGL is generally frusto-conical with a narrower opening closer to the wafer table WT, and a broader opening closer to the projection system PS. At least one gas supply conduit GS is provided which in use delivers a purge gas to the opening which gas is directed towards the wafer table WT so as to prevent resist outgassing products from entering the projection system and potentially contaminating the EUV optics.

In the embodiment of FIG. 6 the side of the projection system wall PSW facing the projection system PS defines an opening having a frusto-conical wall which does not extend all the way through the projection system wall PSW. Instead the side of the projection system wall PSW facing the wafer table WT has an annular recessed section 15 adapted to receive a removable membrane holder 16. The membrane holder 16 has a frusto-conical inner surface 17 that is at the same angle as the frusto-conical surface of the PSW such that when located in the recessed section 15 the membrane holder 16 completes the DGL. Gas supply conduits GS provide a purge gas to an annular space provided between the PSW and the membrane holder 16, and openings 18 in the membrane holder 16 allow the purge gas to exit to the space between the membrane 14 and the wafer table WT so as to prevent resist products from contaminating the membrane 14. A seal 19 is provided between the membrane holder 16 and a stepped portion of the recessed section 15.

The membrane 14 is potentially vulnerable to damage as a consequence of pressure differentials between the projection system PS and the wafer stage. While the membrane may be able to withstand a static pressure differential up to of the order of 500 Pa there is a greater risk of damage during pump-down and venting of the vacuum system owing the turbulent nature of the gas flow and because of pressure spikes when valves are opened and closed. In the embodiment of FIG. 6 this danger is reduced by allowing the membrane holder 16 to be moved to a safe location before pump down and venting takes place. Such a safe location is shown in FIG. 7 where the membrane holder is moved to a second recessed portion 20 formed in the underside of the PSW. The membrane holder may be moved by a robot handling device that may be integrated either as part of the wafer stage or attached to the projection system wall.

As shown in FIG. 7 with the membrane holder 16 removed pressure differences between the projection system and the wafer stage can easily be equilibriated through the opening formed in the PSW, and the gas supply conduits GS can assist in this process by continuing to supply a purge gas (eg air or nitrogen). Alternatively as shown in FIG. 8 when the membrane holder 16 is removed it may be replaced by a cover 21 that is located in the recessed section 15 and which closes the opening apart from a number of channels 22. Channels 22 allow the pressure differential to be equilibriated while the cover 21 provides protection against small particles and contaminants from entering the projection system.

Figure 9B:
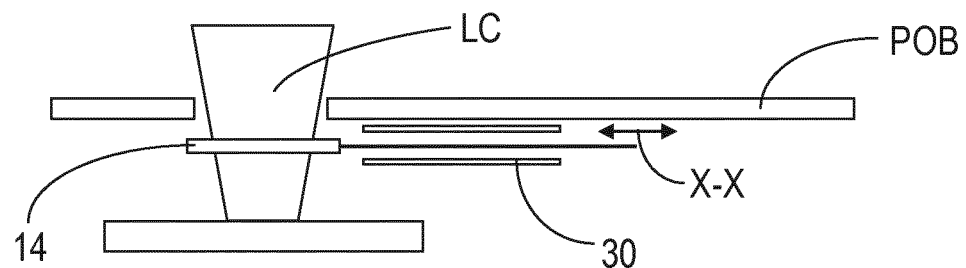

FIGS. 9(a) and 9(b) show an alternative embodiment in which the SPF membrane 14 is mounted for reciprocal movement between a first position (shown in FIG. 9(b)) in which the membrane 14 is positioned in the light cone LC exiting the POB and a second position (shown in FIG. 9(a)) in which the membrane 14 is retracted to a position beneath the bottom surface of the POB and out of the light cone. When in the retracted second position the SPF membrane 14 may be received within a protective sleeve 30 that serves to reduce the risk of damage to the SPF membrane 14 in particular during pump down and venting of the system which process does not need to be relaxed to protect the membrane 14 if it is located within the protective sleeve. The protective sleeve 30 may also be used to attach the SPF membrane 14 assembly to the bottom side of the POB. In this embodiment the SPF membrane is adapted to reciprocate in the direction X-X parallel to the bottom surface of the POB. The reciprocal movement may be effected by any known mechanism, eg a mechanical, electromechanical or electrical actuator. The direction of the reciprocal motion may be other than as shown in FIGS. 9(a) and 9(b). Furthermore, more generally the sleeve may take the form of any protective housing.

A further advantage of this embodiment is that in addition to protecting the SPF membrane 14, the ability to retract the membrane 14 to a position in which the membrane 14 is not in the light cone allows a user to decide whether or not to use the SPF membrane during an imaging process depending on the requirements of that process. For example, while the SPF membrane 14 may be effective at reducing the level of DUV in the radiation there will be a consequential reduction in EUV throughput. If in an imaging process a resist is chosen which is less sensitive to DUV a user may choose to move the SPF membrane 14 to the second position such that it is not used and the process can benefit from the greater EUV throughput. A further advantage of this embodiment of the invention is that a user may if they so wish replace the SPF membrane with some other form of filter, eg either another form of optical filter with other optical properties or with a debris filter.

FIG. 10 shows an alternative embodiment. In this embodiment the gas supply conduit GS divides into a top supply ST and a bottom supply SB. Top supply ST supplies gas to the surface of the membrane 14 facing the projection system, while bottom supply SB supplies gas to the surface of the membrane 14 facing the wafer table WT. FIG. 11 shows the gas flows during normal operation; the gas flowing through the bottom supply prevents contamination from reaching the membrane 14. FIG. 12 shows a possible situation during venting (transition from vacuum to atmospheric pressure): the projection system is at slight overpressure relative to the wafer stage and some air flows from the projection system PS through the top and bottom supply channels into the wafer stage bypassing the membrane 14. All of the air supplied to the device flows into the wafer stage (WS) and in this way the pressure difference between the projection system PS and the WS is limited, thereby preventing damage to the membrane 14.

In the event that a membrane 14 is broken this embodiment of the invention maintains protection of the projection optics. This is illustrated in FIG. 13 where a broken membrane 14 is shown. Here, this embodiment is functionally equivalent to the traditional DGL and maintains optics protection. To demonstrate the effectiveness of this embodiment of the invention, flow rates can be modeled by assuming that the top supply ST is a rectangular pipe with length 20 mm and cross section 60×10 mm, and the bottom supply SB has dimensions 20×30×3 mm. This is incorporated into a flow-network model as shown in FIG. 14, which comprises nodes for the wafer center WC, wafer stage WS, membrane bottom surface MB, membrane top surface MT, supply Sup, and optics mini-environment ME. The nodes are connected by channels (or links) LTC (top cone), LBC (bottom cone), LST (top supply), LSB (bottom supply), and LXM representing a membrane which can be intact (infinite flow resistance) or broken (zero flow resistance). Heavy hydrocarbon contamination HHC is injected in the wafer-center node WC, thus representing resist outgassing.

Results for various flow conditions are in the table below, where PME and PWS are the pressures in mini-environment and wafer stage (imposed as boundary conditions), Q is the supply flow rate into the DGL, Qbc is the flow rate in the bottom cone, dPM is the pressure difference across the membrane, and Suppr. is the suppression ratio defined as the ratio in hydrocarbon partial pressures in wafer stage versus at the membrane bottom surface, or the corresponding location in case of a broken/absent membrane. The value 'inf' indicates suppression ratios larger than 1010, which is essentially infinite. The suppression ratio is critical only during exposure (EUV and hydrogen present), since under those conditions, the optics are most sensitive and the resist outgassing is maximal.

| Gas | Membrane condition | PME (Pa) | PWS (Pa) | Q (Pa m$^3$/s) | Qbc (Pa m$^3$/s) | dPM (Pa) | Suppr. |
|---|---|---|---|---|---|---|---|
| H$_2$ | Broken | 6 | 1 | 11.5 | 1.5 | 0.1 | 6 × 10$^5$ |
| H$_2$ | Intact | 6 | 1 | 11.5 | 0.83 | 5.1 | 400 |
| N$_2$ | Broken | 6 | 1 | 11.5 | 3.3 | 0 | Inf. |
| N$_2$ | Intact | 6 | 1 | 11.5 | 0.75 | 35 | 100 |
| N$_2$ | Broken | 1000 | 1000 | 11.5 | 0.39 | — | 125 |
| N$_2$ | Intact | 1000 | 1000 | 11.5 | 0.17 | 1 | 0.02 |
| N$_2$ | Intact | 1005 | 1000 | 11.5 | 1.6 | 5 | Inf. |
| Air | Broken | 1000 | 1000 | 183 | 9.3 | — | Inf. |
| Air | Intact | 1000 | 1000 | 183 | 2.3 | 1.7 | Inf. |
| Air | Intact | 1035 | 1000 | 183 | 64 | 30 | Inf. |
| Air | Broken | 4000 | 4000 | 183 | 9.2 | — | Inf. |
| Air | Broken | 4022 | 4000 | 183 | 486 | — | Inf. |
| Air | Intact | 4000 | 4000 | 183 | 2.3 | 0.4 | Inf. |
| Air | Intact | 4022 | 4000 | 183 | 184 | 18 | Inf. |

For comparison, a conventional known downflow Qbc is approximately 1.5 Pa m$^3$/s during exposure. It should be noted that the above data is presented as a representative approximation produced by modelling operation for the benefit of the better understanding of this embodiment.

It can be seen that under hydrogen, good suppression can be obtained with a broken membrane, and moderate suppression with the membrane intact. Venting occurs, in two stages: first, the pressure rises to 1 kPa with a small nitrogen flow. At 1000 Pa in both WS and ME, the suppression becomes very low. However, this problem vanishes with a small pressure difference (1005-1000 Pa) which is likely to be the case during venting. Above 1 kPa, the gas changes from nitrogen to air, at a much higher flow rate. It can be seen that 35 Pa pressure difference is enough to direct ⅓ of the air towards the wafer stage. Unfortunately, due to choking, it is not possible to direct all the gas from the supply into the wafer stage. This would require some additional optimization, or postponing the N2-air transition to a higher pressure, e.g. 4 kPa; there, 22 Pa pressure difference is enough to redirect all the supplied air into the wafer stage; this pressure difference is well below the damage threshold for the membrane.

The potential for damage to the SPF membrane when located as part of the DGL from pressure differentials is particularly significant during venting when there is a transition from near vacuum to atmospheric pressure. FIG. 15 shows a vacuum system architecture including an EUV source SRC, illuminator ILL, projection optics box POB, main chamber MCh, wafer stage WS including mirror block MB, pumps P1, P2, reticle stage RET, mini-environment distribution box (gas supply cabinet) MDB, and purge line PL (other purge lines may also be provided as necessary). FIG. 16 shows a detail of this known system and in particular shows the purge line PL in the wafer stage that in use supplies a low flow rate supply of hydrogen towards the SPF membrane 14 to protect the membrane from resist outgas products. During venting, however, a much higher flow of air is used to bring the vessel back to atmospheric pressure.

As shown in FIG. 16 purge line PL is branched at branching point Br. One branch leads to the DGL as normal but is provided with a first restriction Re1. The other branch leads into the wafer stage vessel through a second restriction Re2. Restrictions Re1 and Re2 are designed such that at low flow rates gas will flow predominantly through Re1 and thus when a low flow rate hydrogen supply is provided to protect the membrane from resist outgas products this flow is provided normally. However, during venting when the flow rate of air is much higher than the low flow rate hydrogen, most of the gas flow is through Re2 into the wafer stage FIG. 17 shows a first example of a restriction Re2 that may be used in such an embodiment of the invention. In this example Re2 comprises a pressure relief valve. In this example a short section of pipe extends from branching point Br and this section of pipe is provided with a flange Fl at its end. Connected to the flange Fl by a leaf spring LS is a valve closure member in the form of lid Li. In a normal default position of this pressure relief valve the LS biases that closure member Li against the flange Fl to close the pressure relief valve. The valve forming restriction Re2 will therefore remain closed when there is a low flow rate hydrogen supply. However, during a venting process where there is a high flow rate air supply the closure member Li moves away from the flange Fl to open the pressure relief valve and to allow the majority of the air supply to pass into the wafer stage WS away from the membrane.

The embodiment of FIG. 17 has the advantage of being of simple construction and low cost. FIG. 18 shows another advantageous embodiment in which there are no moving parts that may cause unwanted stiction causing the valve to not open properly when needed, and which may generate unwanted particles that have the potential to contaminate the wafer stage. In this embodiment there are provided a series of N fixed planar elements, which in this examples are disc-like plates, that are provided parallel and spaced from the flange Fl and each other by a fixed distance H. All but one of the fixed plates have a central opening the diameter of which matches the diameter Di of the branching pipe section, the exception being the plate that is furthest from the flange Fl. All the plates and the flange have the same outer diameter Do. In the embodiment shown in FIG. 18 N=3, H=0.3 mm, Di=3.4 cm and Do=20 cm. Modelling the flow rates shows that for this embodiment for air, at 12 kPa pressure at the branching point Br, the flow rates through the purge tube to the membrane and through the side branch into the WS are 45 and 140 Pa m3/s, respectively, which is a 24:76 ratio at 185 Pa m3/s total flow rate. For hydrogen, at 0.9 kPa pressure, the flow rates are 2.8 and 2.2 Pa m3/s, i.e., a 56:44 ratio at 5 Pa m3/s total flow rate.

One advantage of placing the SPF membrane at the DGL is that the membrane serves to protect the EUV optics in the projection system from resist outgassing products and thus enables the resist outgassing specification to be less stringent. This can for example mean that gas flows into the DGL can be reduced. However, one consequence of placing the SPF membrane in the DGL is that resist outgassing products, in particular carbon, accumulate on the SPF membrane and in time will reduce the EUV transmission of the membrane. Accumulation of carbon on the membrane could be reduced by increasing the suppression of the DGL to conventional levels (ie the levels that it would have without a membrane present) but this removes one of the advantages of providing the SPF membrane at the DGL.

FIG. 19 shows an embodiment of the invention which addresses this issue. In this embodiment heating filaments 24 are provided in the gas supply conduits GS. The purpose of the heating filaments 24 is to generate reactive radicals such as hydrogen radicals, which will serve both to suppress carbon contamination of the membrane 14 and to clean any carbon that may have been deposited on the membrane 14. The cleaning by radicals may be carried out at any time, such as for example during a daily programmed maintenance. The DGL suppression rate can be set such that on a daily basis, the SPF requires a maximum of a few minutes of cleaning. For example, a supply of hydrogen radicals of the order of 1017 to 1018 hydrogen atoms/cm3 per second can provide a cleaning rate can be estimated to be in the order of 0.1 nm/min which will increase the EUV transmission by 0.5%/min. As an alternative to hydrogen other gases may be supplied which upon heating would generate other types of reactive products that could serve to clean the membrane.

This embodiment of the invention enables a cleaning capability of the membrane in-situ even during wafer exposure and keeps the outgassing suppression capability of the DGL, if needed. If in-situ cleaning is not used it also enables an offline cleaning action (e.g. daily) which will have major advantage for the lifetime of the membrane and also allows for relaxation of the DGL suppression capabilities and flow requirements. This latter can reduce the thermal heat load of the DGL towards the wafer which in turn will improve overlay performance. It will be understood that the embodiment of FIG. 19 may also be applied in combination with the embodiments of FIGS. 6 to 18.

It may also be desirable to strengthen the membrane by the use of a reinforcing grid as shown in FIGS. 20(a)-(d) which show a membrane 14 in plan view with in each figure a reinforcing grid 23 being provided. The grid 23 supports the membrane 14 and reduces the distance that the membrane 14 has to span unsupported thus increasing the strength of the membrane to pressure differences. Due to the fact that the wafer is scanned under the DGL aperture, any grid elements parallel to the scanning direction will give rise to completely unexposed lines on the resist. Thus, the grid for the DGL SPF needs to be designed in such a way that no grid lines exist parallel to the scanning direction.

FIGS. 20(a)-(d) show three examples of a grid that can be incorporated into the SPF for added strength without interfering with the resist exposure. With respect to FIGS. 20(a)-(d) the wafer is scanned in the vertical direction. FIG. 20(a) shows the opening covered by the SPF 14 with horizontal grid lines. FIG. 20(b) shows the same SPF membrane 14 but now with curved lines following the curvature of the light slit. FIG. 20(c) shows the SPF membrane incorporating crossed diagonal grid lines. FIG. 20(d) shows the grid in a repeating polygons—in this example hexagons although other polygons are possible. Of course, other possible grid shapes and orientations are possible. The most important condition being that no grid line is aligned to the scanning direction.

It will be understood that the embodiment of FIGS. 20(a)-(d) could be applied to any of the embodiments of FIGS. 6 to 19 or could be applied independently of those embodiments. While the embodiment of FIGS. 20(a)-(d) is particularly useful when the membrane is formed as part of the DGL in view of the potential pressure differentials at that location, such a reinforced membrane could be applied at any of the aforesaid locations for the SPF membrane. It will also be understood that while a slit-shaped membrane is described any other shape may be possible as long as the reinforcing lines are not aligned with the scanning direction.

Suitable materials for the grid include one or more of Zr, Mo, Ni, Cr, Ru, Nb, W, Ta, MoSi2, NbSi2, silicon nitride, and silicon with a capping material such as Mo, Ru or MoSi2. The dimensions of the grid lines may vary and together with the total length of the grid lines will represent a trade-off with EUV transmission. The thicker the grid lines and the greater the total length of the lines then the stronger the membrane will be (which may allow the membrane to be thinner which will have a positive effect on EUV transmission), while at the same time the presence of the grid lines will themselves block EUV transmission and if they are too thick or too long may have an overall negative impact on EUV transmission.

In addition to the grid orientation, the most important grid parameters are distance between parallel lines, line thickness and height. These parameters need to be optimized for maximum strength and minimum EUV light absorption. The net effect of the grid will be a reduced light throughput (in the order of a few percent) but no impact on imaging.

The main advantage of this embodiment of the invention is that it adds strength to the SPF membrane 14 and allows thinner membranes with higher EUV transmission to be implemented. A further advantage is that the grid may contain the contamination in case of membrane rupture. This is because the membrane will typically tear from a single or a few breaking points. The tearing of a membrane can propagate from the breaking point(s) until the crack reaches the membrane frame. In the case of a membrane without a grid, the whole membrane tears possibly giving rise to a large amount of debris. In the presence of a grid, the crack propagates until it reaches a grid line. By stopping the propagation of a crack on the grid lines, only a part of the membrane tears which will give rise to much lower release of debris.

The SPF may also include a layer of EUV transparent material which may comprise one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U, even more especially B, C, Si, Sr, Sc, Ru, Mo, Y and Zr, and yet even more especially Zr. The transparent material layer may be a metallic layer. Also, compounds comprising one or more of these elements may be applied as an EUV transparent material layer. Such compounds include silicides, oxides, borides and nitrides, which are solid at room temperature, of one or more elements selected from the group consisting of Be, B, C, Si, P, S, K, Ca, Sc, Sr, Rb, Y, Zr, Nb, Mo, Ru, Rh, Ag, Ba, La, Ce, Pr, Ir, Au, Pa and U. Examples of such compounds include YSi2, ZrSi2, NbSi2, and MoSi2. Such an EUV transparent material layer may be arranged to further increase the ration of EUV/non-desired radiation and/or to reduce or even eliminate propagation of debris while allowing transmission of EUV radiation.

Transmission for EUV radiation may be defined as follows. In an embodiment, the EUV radiation has a wavelength in the range of about 13-14 nm, especially about 13.3-13.7 nm, such as about 13.5 nm, or a wavelength in the range of about 6-7 nm. In an embodiment, the transmission of at least about 80% applies for all wavelengths in one or more of the above defined wavelength regions (such as about 13.3-13.7 nm or about 6-7 nm). The phrase "a transmission for EUV radiation having a wavelength in the range of x-y nm of at least about 80%" may indicate that for a predetermined wavelength selected from the indicated range, the transmission is at least about 80%. This does not exclude that at other wavelengths within the same range, the transmission may be smaller.

Similarly, DUV radiation has a wavelength in the range of about 130 nm to 400 nm. For DUV transmission is considered as a mean transmission over that range, and a transmission of less than 30% may indicate that the mean transmission from 130 nm to 400 nm is less than about 30%. This does not exclude that at some wavelengths within that range the transmission may be larger than 30%.

Figure 4:
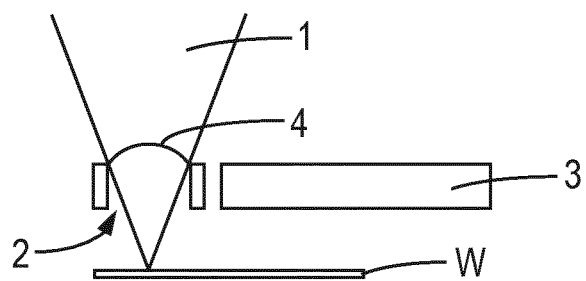
FIG. 4 is a view of one possible form of spectral purity filter.
Figure 5:
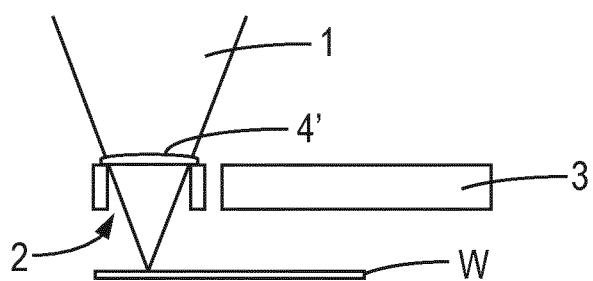
FIG. 5 is a view of another possible form of spectral purity filter.

It is known that transmission through the SPF can vary across the beam width for different orders. FIGS. 4 and 5 show two possible embodiments of the invention addressing this issue. Referring to FIG. 4 firstly the EUV beam 1 is shown passing through a slit 2 in the wall 3 of the projection system. This slit 3 is covered by a curved membrane SPF 4 and the curvature of the membrane 4 can be chosen to reduce this variation. In the embodiment of FIG. 5 the curved membrane 4 is replaced by a membrane SPF 4' of varying thickness where the variation of thickness can be used to compensate for transmission variation.

It should also be noted that if the SPF membrane is subject to wrinkling this may be mitigated by removing the wrinkling by stretching the SPF membrane on a frame. Alternatively or in addition to that, the SPF membrane may be (further) stretched by applying a gas to provide a suitable pressure without damaging the membrane. This pressure need not be large, for example an over-pressure in the PS of about 20 Pa may be sufficient to remove any membrane wrinkles and thus membrane wrinkles can be removed in situ.

Although steps may be taken as discussed above to strengthen the SPF membrane and/or to limit the pressure differentials that the SPF membrane may be exposed to, in particular when the membrane is formed as part of the DGL, nonetheless it remains possible that the SPF membrane may rupture. This leads to the possibility that if the membrane does rupture parts of the membrane may land on a mirror or other optical component in either the illumination system or the projection system which may negatively affect the imaging and dose uniformity properties of the apparatus and may cause extended down time for cleaning of the mirrors and removal of the membrane fragments.

To mitigate against this possibility in an embodiment of the invention a membrane capture member may be provided at one or more suitable locations depending on the location of the SPF membrane. Suitable locations for the membrane capture member include the entrance into the illumination system IL and the entrance into the projection system PS. FIGS. 21(a)-(c) illustrate three possible forms for the membrane capture member in the form of a wire mesh. The mesh needs to meet the objectives of enabling capture of a membrane or membrane fragment, while at the same time not presenting a serious obstacle to radiation throughput. In practical embodiments of the invention the mesh should have an open area of about 98% in order to have a low impact on radiation throughput. FIG. 21(a) shows a mesh having a pitch of 1 mm in both directions with the mesh formed of lines having a diameter of 10 microns which leaves an open space of about 98% but the resulting mesh leaves open spaces through which relatively large membrane fragments could pass. FIG. 21(b) shows a better arrangement in which the open spaces of the mesh are rectangular with dimensions of 2 mm×0.5 mm (ie a ratio of 4:1 in terms of the lengths of the sides of the open areas of the mesh cells) and FIG. 21(c) is better still with mesh cells having a dimension of 4 mm×0.25 mm (a ratio of 16:1). Suitable materials for the membrane capture member include Ni, Cr, Ru, Mo, SiN, W or stainless steel all of which are materials with good mechanical strength and resistance to EUV-induced plasma. The membrane capture member can be positioned far enough from the image plane of the reticle and the image plane of the wafer not to form an image of the capture member on the resist.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate.

The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measure or process an object such as a wafer (or other substrate) or mask (or other patterning device) either in vacuum or in ambient (non-vacuum) conditions, such as, for example in plasma etching apparatus or deposition apparatus.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way. The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and clauses and their equivalents.

The invention claimed is:

1. A lithographic apparatus comprising:
   an illumination system configured to condition a radiation beam;
   a support structure configured to support a patterning device;
   a substrate table configured to hold a substrate;
   a projection system configured to project a pattern imparted to the radiation beam by the patterning device onto a target portion of the substrate; and
   a filter adjacent the substrate table and configured to reduce or eliminate deep ultraviolet (DUV) radiation, wherein the filter at least partially closes an opening in the projection system, and wherein the filter comprises a membrane.

2. The lithographic apparatus as claimed in claim 1, wherein the filter is movable between a first position in the path of the radiation beam and a second position in which the filter is not in the path of the radiation beam.

3. The lithographic apparatus as claimed in claim 2, wherein the filter is mounted in a holder, the holder being movable between a first location wherein the filter is in the first position and a second location wherein the filter is in the second position.

4. The lithographic apparatus as claimed in claim 3, wherein the projection system has a projection system wall, the projection system wall including the opening, and wherein the first location comprises a recessed portion of the projection system wall surrounding the opening.

5. The lithographic apparatus as claimed in claim 4, wherein the holder includes an inner annular wall, and wherein the inner annular wall forms a part of the opening when the holder is in the first location.

6. The lithographic apparatus as claimed in claim 5, wherein the holder includes conduits to permit a gas to be supplied to the opening.

7. The lithographic apparatus as claimed in claim 2, further comprising a closure member adapted to close the opening when the filter is removed.

8. The lithographic apparatus as claimed in claim 7, wherein the closure member includes a first conduit connecting an interior and an exterior of the projection system, and a second conduit for delivering gas to the first conduit.

9. The lithographic apparatus as claimed in claim 1, further comprising at least one conduit configured to supply gas to the opening such that gas is supplied to both sides of the filter.

10. The lithographic apparatus as claimed in claim 1, further comprising a gas supply configured to supply hydrogen gas to a surface of the filter, and wherein the gas supply includes a heating element configured to generate hydrogen radicals that are delivered to the surface of the filter.

11. The lithographic apparatus as claimed in claim 1, further comprising a gas supply line configured to deliver gas to a location adjacent the filter, and wherein the gas supply line includes a branch configured to deliver gas to a location remote from the filter, the gas supply line and the branch including respective flow restriction elements configured such that, at a first gas flow rate, gas is delivered to the filter, and at a second gas flow rate greater than the first gas flow rate, the majority of gas is supplied to the remote location.

12. The lithographic apparatus as claimed in claim 1, wherein the filter further comprises a layer of capping material.

13. The lithographic apparatus as claimed in claim 1, wherein the filter comprises layers of niobium, molybdenum and silicon.

14. The lithographic apparatus as claimed in claim 1, wherein the membrane is curved and configured to compensate for transmission variation.

15. The lithographic apparatus as claimed in claim 1, wherein the membrane has a varying thickness and is configured to compensate for transmission variation.

16. The apparatus according to claim 1, wherein the filter has at least one of the following characteristics: (a) a DUV transmission of less than 30%, and (b) is an extreme ultraviolet (EUV) transmission filter with an EUV transmission of at least 80%.

17. The apparatus according to claim 1, wherein the membrane includes polysilicon, a multilayer material, a carbon nanotube material or graphene.

18. A method of manufacturing a device using a lithographic apparatus, comprising:
   generating a beam of radiation including extreme ultraviolet (EUV) radiation and deep ultraviolet (DUV) radiation;
   conditioning the radiation beam in an illumination system and directing the radiation beam onto a patterning device;
   projecting a patterned radiation beam onto a substrate supported on a substrate table by means of a projection system;
   filtering, using a filter, the DUV radiation from the radiation beam in a location adjacent the substrate table; and
   at least partially closing an opening in the projection system using the filter, wherein the opening is in a wall of the projection system facing the substrate table, and wherein the filter comprises a membrane.

19. The method as claimed in claim 18, further comprising removing wrinkles from the membrane by maintaining a pressure differential across the membrane.

20. The method according to claim 18, wherein the membrane includes polysilicon, a multilayer material, a carbon nanotube material or graphene.

21. The method according to claim 18, wherein the filtering the DUV radiation from the radiation beam comprises transmitting less than 30% of the DUV radiation in the radiation beam and at least 80% of the EUV radiation in the radiation beam.

* * * * *